United States Patent [19]
Tomikawa

[11] Patent Number: 5,869,959
[45] Date of Patent: *Feb. 9, 1999

[54] SPECTRUM ANALYZER

[75] Inventor: Shigeo Tomikawa, Gyoda, Japan

[73] Assignee: Advantest Corporation, Tokyo, Japan

[*] Notice: The terminal 23 months of this patent has been disclaimed.

[21] Appl. No.: 50,352

[22] PCT Filed: Sep. 1, 1992

[86] PCT No.: PCT/JP92/01114

§ 371 Date: Oct. 17, 1994

§ 102(e) Date: Oct. 17, 1994

[87] PCT Pub. No.: WO93/05403

PCT Pub. Date: Mar. 18, 1993

[30] Foreign Application Priority Data

Sep. 2, 1991 [JP] Japan ................................. 3-221773
Sep. 6, 1991 [JP] Japan ................................. 3-227261

[51] Int. Cl.[6] .............................................. G01R 23/16
[52] U.S. Cl. ................................... 324/76.27; 324/76.19
[58] Field of Search ........................... 324/76.19, 76.23, 324/76.24, 76.25, 76.26, 76.27, 76.35

[56] References Cited

U.S. PATENT DOCUMENTS 4,611,164   9/1986   Mitsuyoshi et al. .............. 324/76.19
4,839,582   6/1989   Fukaya et al. .................... 324/76.23
4,839,583   6/1989   Takano et al. .................... 324/76.19
4,890,099  12/1989   Takano ......................... 324/76.19 X
5,162,724  11/1992   Katayama et al. ................ 324/76.19

FOREIGN PATENT DOCUMENTS 284 821  10/1988  European Pat. Off. .
297 589   1/1989  European Pat. Off. .
364 771   4/1990  European Pat. Off. .

Primary Examiner—Kenneth A. Wieder
Assistant Examiner—Glenn W. Brown
Attorney, Agent, or Firm—Staas & Halsey

[57] ABSTRACT

A spectrum analyzer includes a synchronizing signal input terminal (27A) and a sweep control signal generator (32) inserted between the synchronizing signal input terminal (27A) and a ramp address generator (23). In the case of making a frequency analysis of an input signal Sx which is a burst wave, a synchronizing signal SY, synchronized with the burst wave, is applied to the synchronizing signal input terminal (27A) from the outside and a sweep control signal SC which rises an arbitrary period of time after the synchronizing signal SY and has an arbitrary width is generated by the sweep control signal generator (32). The sweep control signal SC is applied to the ramp address generator (32), which sweeps, in each burst, a ramp voltage VR for controlling a local oscillator (16) and an address AD for effecting a write into a signal loading memory (19), and in the other periods the sweep is stopped.

8 Claims, 13 Drawing Sheets

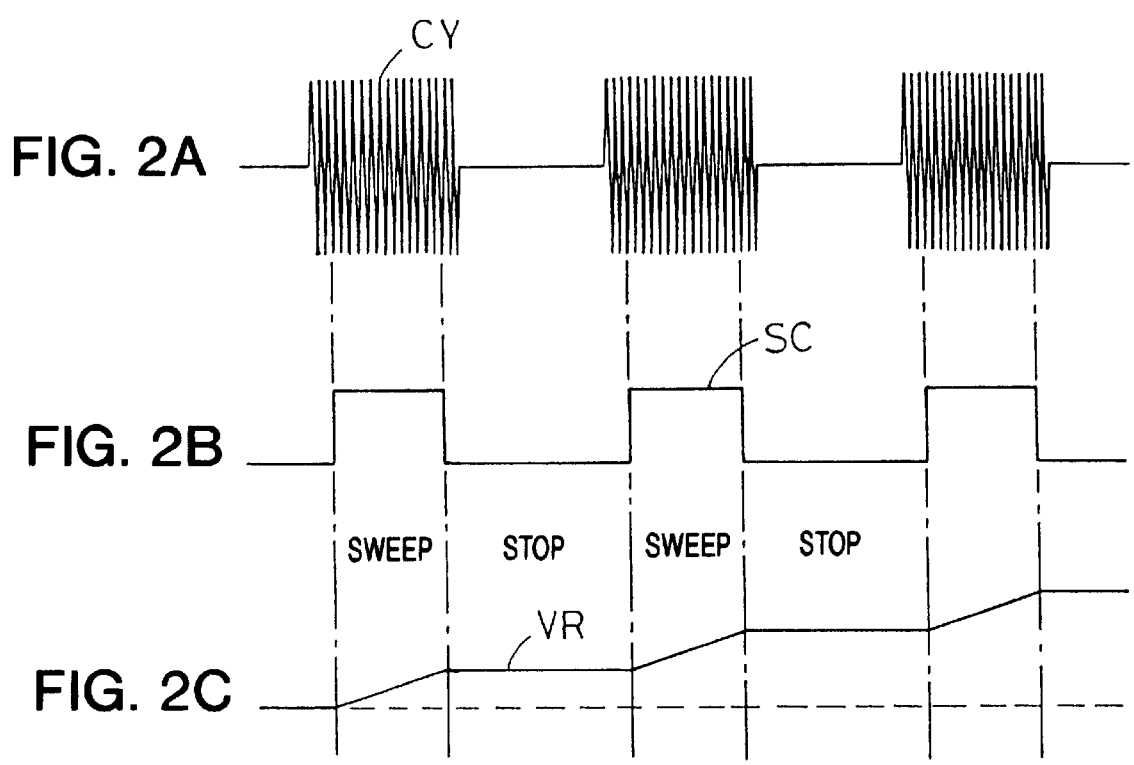
FIG. 2A
FIG. 2B
FIG. 2C
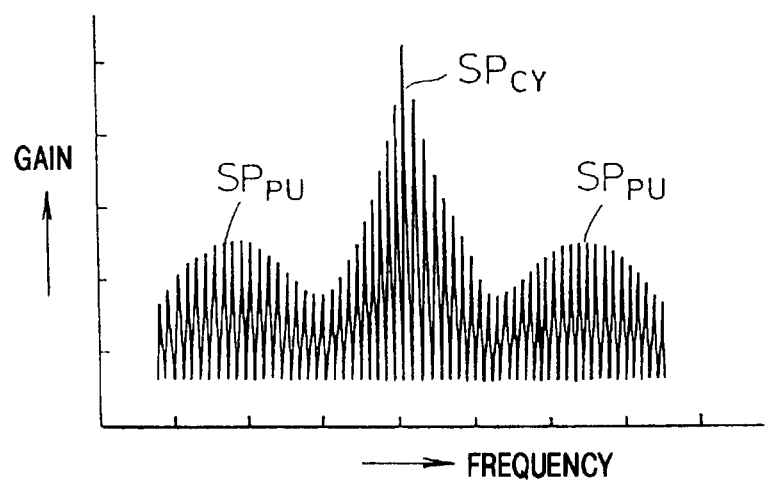
FIG. 3

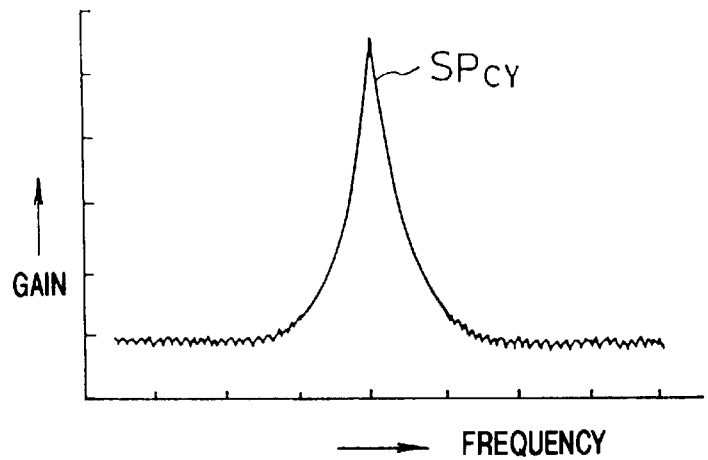
FIG. 4
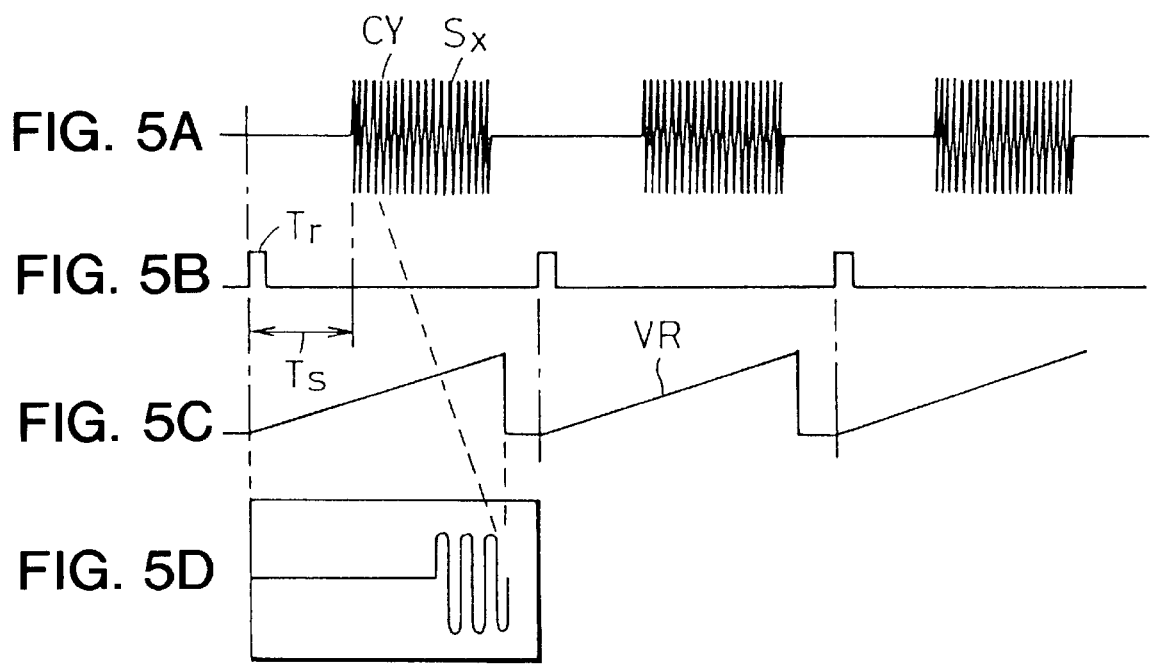
FIG. 5A
FIG. 5B
FIG. 5C
FIG. 5D

SPECTRUM ANALYZER

TECHNICAL FIELD

The present invention relates to a spectrum analyzer equipped with a function of analyzing frequency components contained in various signals and displaying their frequency spectra.

BACKGROUND ART

As is well-known in the art, a spectrum analyzer continuously sweeps the local signal frequency which is mixed in the measuring frequency band of an input signal to sequentially convert respective frequency components in the measuring frequency band into intermediate-frequency signals of certain frequencies (difference frequencies) and displays their levels on a display screen with the abscissa representing frequency. Moreover, such a spectrum analyzer is usually designed to permit the observation of the waveform of a desired frequency component of the input signal in the time domain, and in such a waveform observation, the local signal frequency is fixed at a value so that the frequency component desired to observe may be detected as an intermediate-frequency signal, and the amplitude envelope of the intermediate-frequency signal thus obtained is displayed on the display screen with the abscissa representing the time axis.

FIG. 1 is a block diagram showing the basic construction of such a conventional spectrum analyzer. In the case where this device is used in a frequency analysis mode (a frequency sweep mode), a select switch 17 selects an output ramp voltage VR of a ramp address generator 23 and provides it to a local oscillator 16, and a select switch 29 selects, for example, the output of a trigger signal generator 26 to supply the ramp address generator 23 with a trigger signal Tr generated by the trigger signal generator 26 on the basis of a demodulated signal of a signal to be measured Sx applied to an input terminal 11. A sweep control signal SC is provided to an input terminal 27. The signal Sx applied to the input terminal 11 is frequency mixed by a mixer 12 with a local signal SL from the local oscillator 16, and the difference frequency component is extracted by an intermediate-frequency filter (which is a band-pass filter and will hereinafter be referred to as an IF filter) 13.

In the frequency analysis mode, the oscillation frequency of the local oscillator 16 is swept over a certain range by the ramp voltage VR from the ramp voltage generator 23, and consequently, respective frequency components in the measuring frequency band of the input signal are sequentially obtained as intermediate-frequency signals at the output of the IF filter 13. The output of the IF filter 13 is logarithmically amplified by a logarithmic amplifier 14 and the amplitude of its output is envelope detected by a detector 15. The detected output level is converted by an A/D converter 18 into a digital value upon each application of a high-speed clock CK and is stored in a memory 19 by an address AD which is generated by the ramp address generator 23 upon each application of the clock CK. The signal data thus stored in the memory 19 is transferred therefrom to a memory for image display use 20 by a read/write address for transfer use TAD supplied from a controller 31. Upon completion of the transfer, an image signal generator 21 repeatedly reads out the signal data from a series of addresses in a data storage area of the memory 20 for each horizontal scanning line corresponding to each height (corresponding to the signal level) on the display screen. When the value (the level value) of signal data is present which agrees with the level corresponding to respective horizontal scanning line number, the image signal generator generates an image signal which goes high at that position (corresponding to the time position) on the horizontal scanning line corresponding to the address value of the signal data but remains low at other positions. The image signal is applied to a raster scanning display 22 for display thereon. The abscissa of the display screen represents frequency and the ordinate represents level.

To perform the above-described operation, the ramp address generator 23 is initialized by a reset signal RST from the controller 31, and while the sweep control signal SC applied to the input terminal 27 is at the H-logic level, it counts the high-speed clock pulses CK from predetermined minimum to maximum value which are provided as data DATA from the controller 31 and sequentially outputs the count values as addresses AD and, at the same time, it converts each count value into an analog value for output as the ramp voltage VR. When the maximum value of the address AD is reached, the ramp address generator yields and applies an interrupt signal INT to the controller 31. When supplied with the interrupt signal INT, the controller 31 supplies the read/write address for data transfer used TAD to the memory 19, from which the signal data is transferred to the memory 20. Upon completion of the data transfer, the controller generates a trigger enable signal TE, putting the ramp address generator 23 in the state in which it is ready for counting again the clock pulses CK from the minimum value.

In the case of observing the waveform of a desired frequency component of the input signal in the time domain (This mode of observation will hereinafter be referred to as a zero-span mode.), a variable voltage source 24 is selected by the select switch 17 and a desired fixed voltage is supplied to the local oscillator 16, from which the local signal SL of a fixed frequency is applied to the mixer 12. Hence, in this instance, the output of the detector 15 becomes an envelope waveform of the amplitude of the specified frequency component in the input signal which corresponds to the lapse of time. On the other hand, the select switch 29 is connected to, for example, the output of the trigger signal generator 26. For example, when the signal to be measured Sx is a burst wave, the output level of the detector 15 is compared by a comparator 25 with a predetermined level to detect the rise of each burst and the detected output is applied to the trigger signal generator 26 to generate therefrom the trigger pulse signal Tr of a fixed width. Thus the trigger signal Tr which is synchronized with each burst can be obtained.

Upon each application of the trigger signal Tr, the ramp address generator 23 counts the clock pulses CK from predetermined minimum to maximum value and provides each count value, as the address AD, to the memory 19. In consequence, the detected outputs of the detector 15 are sequentially converted into digital values as in the above and they are stored in those areas of the memory 19 specified by a sequence of addresses AD from the ramp address generator 23, after which the signal data thus stored is transferred to the memory 20. The signal data read out of the memory 20 is converted by the image signal generator 21 into image signals, which are displayed on the display screen of the display 22. The abscissa of the display screen represents time and the ordinate represents level.

In the above it is described that the fixed voltage which is applied to the local oscillator 16 in the zero-span mode is obtained from the variable voltage source 24 via the select switch 17, but in the actual spectrum analyzer such a variable voltage source 24 is not provided but instead provision is made merely for stopping the sweep of the ramp voltage VR at a desired voltage value and for applying the fixed voltage to the local oscillator 16. To facilitate a better understanding of operations in the frequency analysis mode and the zero-span mode, however, the above description has been given on the assumption that the select switch 17 and the variable voltage source 24 are used.

The spectrum analyzer has sweep control terminals 27 and 28, in addition to the input terminal 11 for the input of the signal Sx as described above. While the sweep control signal SC (shown in FIG. 2, Row B, for instance) which is applied to the sweep control terminal 27 is at the H-logic level, the ramp address generator 23 linearly increases its output voltage VR toward a predetermined maximum value at a fixed gradient as shown in FIG. 2, Row C, and hence in this while the oscillation frequency of the local oscillator 16 linearly increases. When the sweep control signal SC goes down to the L-logic level, the ramp address generator 23 stops the sweep of its output voltage VR, and consequently, the frequency sweep of the local oscillator 16 is stopped. Thus, the use of the sweep control terminal 27 permits control of the local oscillator 16 from the outside to continue or stop its frequency sweep operation. On the other hand, upon each application of an external trigger pulse EXTr to the sweep control terminal 28, the ramp address generator 23 once sweep the output voltage VR from the minimum to the maximum value.

The sweep control terminal 27 is used in the case of analyzing frequency components contained in a carrier CY of a burst wave such as depicted in FIG. 2, Row A. That is, in the case where the burst wave, which is the signal to be measured Sx, is input into the spectrum analyzer and its frequency components are analyzed over one continuous range of time containing a plurality of bursts, frequency spectra $SP_{PU}$ of pulses of a burst modulation wave as well as a frequency spectrum $SP_{CY}$ of the carrier CY are displayed as shown in FIG. 3. This gives rise to a disadvantage that the presence or absence of harmonics of the carrier CY cannot be observed.

To avoid this, it is customary in the prior art to generate, outside the spectrum analyzer, the sweep control signal SC synchronized with the burst wave as shown in FIG. 2, Row B and input the sweep control signal SC to the sweep control terminal 27 of the spectrum analyzer, effecting control to sweep the oscillation frequency of the local oscillator 16 during the existence of the carrier CY of the burst wave and stop the frequency sweep when the carrier CY does not exist. By this control, only the frequency spectrum $SP_{CY}$ of the carrier CY is displayed on the display 22 of the spectrum analyzer as depicted in FIG. 4. Incidentally, this control state is referred to as gated sweep.

Thus the prior art has the disadvantage of involving the use of a circuit for generating the sweep control signal SC synchronized with the burst wave, because the sweep control signal must be produced outside the spectrum analyzer. Further, since signals to be measured range from low-frequency to ultrahigh-frequency signals of the gigahertz band, it is difficult to obtain the sweep control signal SC by direct waveform shaping of the burst wave.

In the mode in which to display the time-domain waveform of the input signal (i.e. in the zero-span mode), since the ramp address generator 23 generates a sequence of addresses AD (and consequently the ramp voltage VR shown in FIG. 5, Row C) upon each application of the trigger signal Tr (or EXTr), the loading of data into the memory 19 starts in synchronization with the external trigger signal EXTr which is applied to the sweep control terminal 27 or the trigger signal Tr which is provided from the trigger signal generator 26 as referred to above. Hence, if the signal to be measured Sx is a burst wave as shown in FIG. 5, Row A, the trigger signal Tr is not always generated in the duration of the burst as depicted in FIG. 5, Row B and, according to the temporal relation between the trigger signal Tr and the burst wave CY, a no-signal period Ts may sometimes exist from the timing of the trigger signal Tr to the period in which the carrier CY of the burst wave is present. When the generation of the ramp voltage VR (and consequently the address AD) is initiated in response to each trigger signal Tr as shown in FIG. 5, Row C, the A-D converted output obtained in the no-signal period Ts is also loaded in the memory 19 and then transferred therefrom to the memory 10, resulting in a disadvantage that the carrier CY desired to observe primarily cannot be displayed all over the display screen.

A first object of the present invention is to provide a spectrum analyzer which is equipped with a function of generating the sweep control signal and adapted to execute the gate sweep mode when supplied, from the outside, with a burst-like signal to be measured and a synchronizing signal synchronized therewith.

A second object of the present invention is to provide a spectrum analyzer which is capable of displaying, in the zero-span mode (i.e. in the time-domain waveform display mode), the waveform of the signal to be measured on a display, starting at a desired timing of the signal.

DISCLOSURE OF THE INVENTION

According to a first aspect of the present invention, the spectrum analyzer includes a synchronizing signal input terminal for the input of a synchronizing signal synchronized with a burst wave, and a sweep control signal generator for generating a sweep control signal delayed behind the synchronizing signal from the synchronizing signal input terminal for an arbitrary period of time. The synchronizing signal input via the synchronizing signal input terminal is applied to the sweep control signal generator to output therefrom the sweep control signal synchronized with the burst wave, and the sweep control signal is provided to the ramp address generator of the spectrum analyzer to effect control to execute and stop the frequency sweep. Thus, according to the first aspect of the present invention, the gated sweep can be carried out by applying to the synchronizing signal input terminal the synchronizing signal synchronized with the signal to be measured. Hence an easy-to-handle spectrum analyzer can be offered.

According to a second aspect of the present invention, the spectrum analyzer includes a variable delay circuit for delaying the trigger signal for an arbitrary period of time. The spectrum analyzer is adapted so that the trigger signal from the trigger signal generator or from the outside is delayed by the variable delay circuit for an arbitrary period of time and then applied to the ramp address generator, whereby the timing for starting the generation of the address to be provided to the memory can be set to an arbitrary timing.

With the construction according to the second aspect of the present invention, the timing for starting the loading of data into the signal storage memory can be selected to be the timing delayed behind the timing of the trigger signal for an arbitrary period of time, and consequently, even if the signal to be measured is an intermittent signal such as a burst wave, only the signal portion desired to observe can be loaded into the memory. Hence it is possible to display only the waveform of the signal desired to observe over the entire area of the display screen—this increases the accuracy of waveform observation.

BRIEF DESCRIPTION OF THE DRAWINGS

FIG. 2 is a waveform diagram for explaining a burst wave and an example of the sweep control signal which is used to make a frequency analysis of the burst wave in the gated-sweep mode.

FIG. 3 is a graph showing the results of analysis obtained when the burst wave was frequency analyzed in a mode not the gated-sweep mode.

FIG. 4 is a graph showing the results of frequency analysis of the burst wave made in the gated-sweep mode.

FIG. 5 is a waveform diagram for explaining a defect of the prior art in the zero-span mode.

BEST MODE FOR CARRYING OUT THE INVENTION

Figure 6:
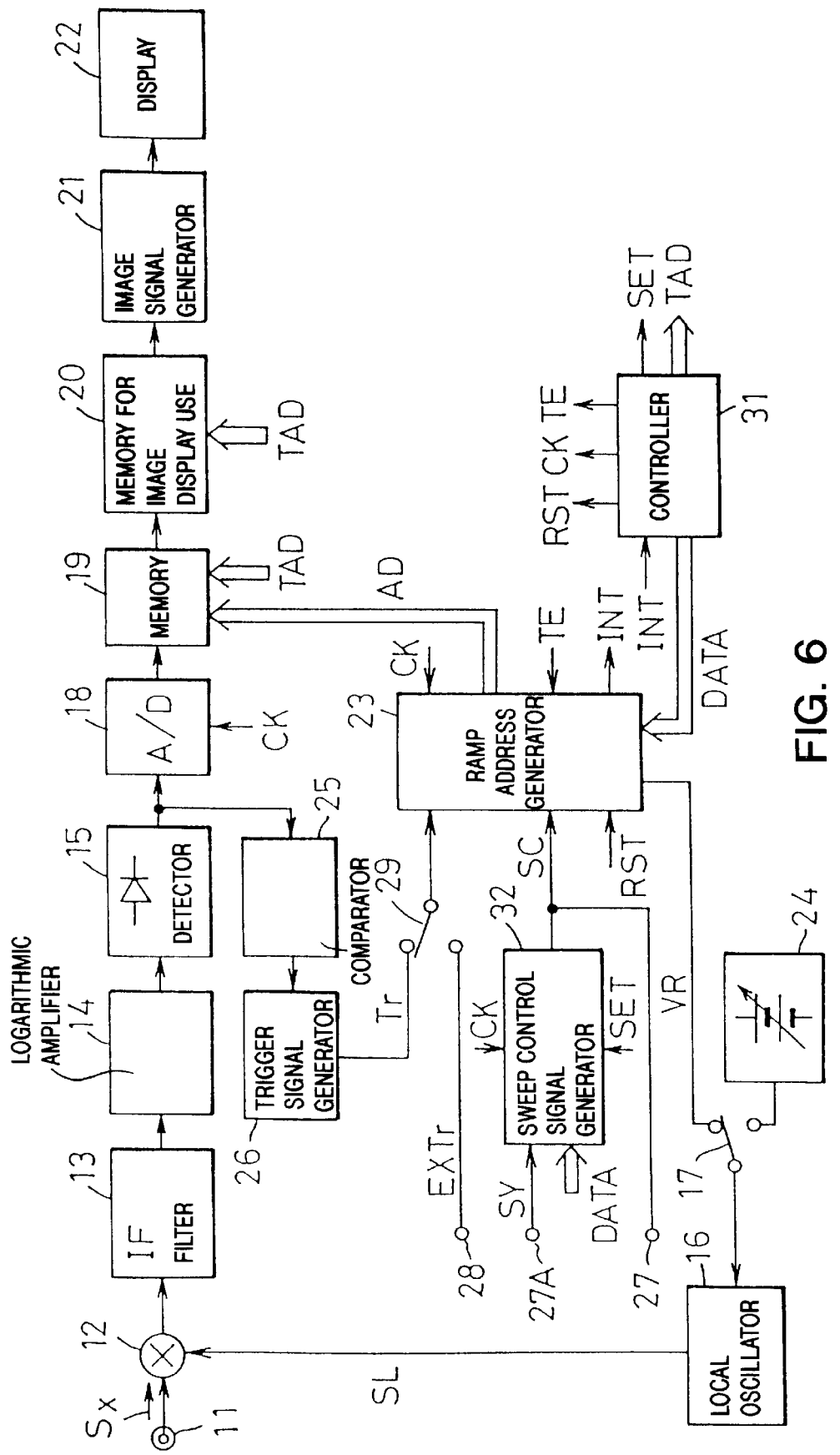
FIG. 6 is a block diagram for explaining an embodiment according to the first aspect of the present invention.

FIG. 6 illustrates an embodiment according to the first aspect of the present invention. This example shows an application of the present invention to a conventional ordinary spectrum analyzer of FIG. 1, in which like parts are identified by like reference numerals. According to this embodiment, a synchronizing signal input terminal 27A and a sweep control signal generator 32 are provided in the construction of FIG. 1.

Figure 1:
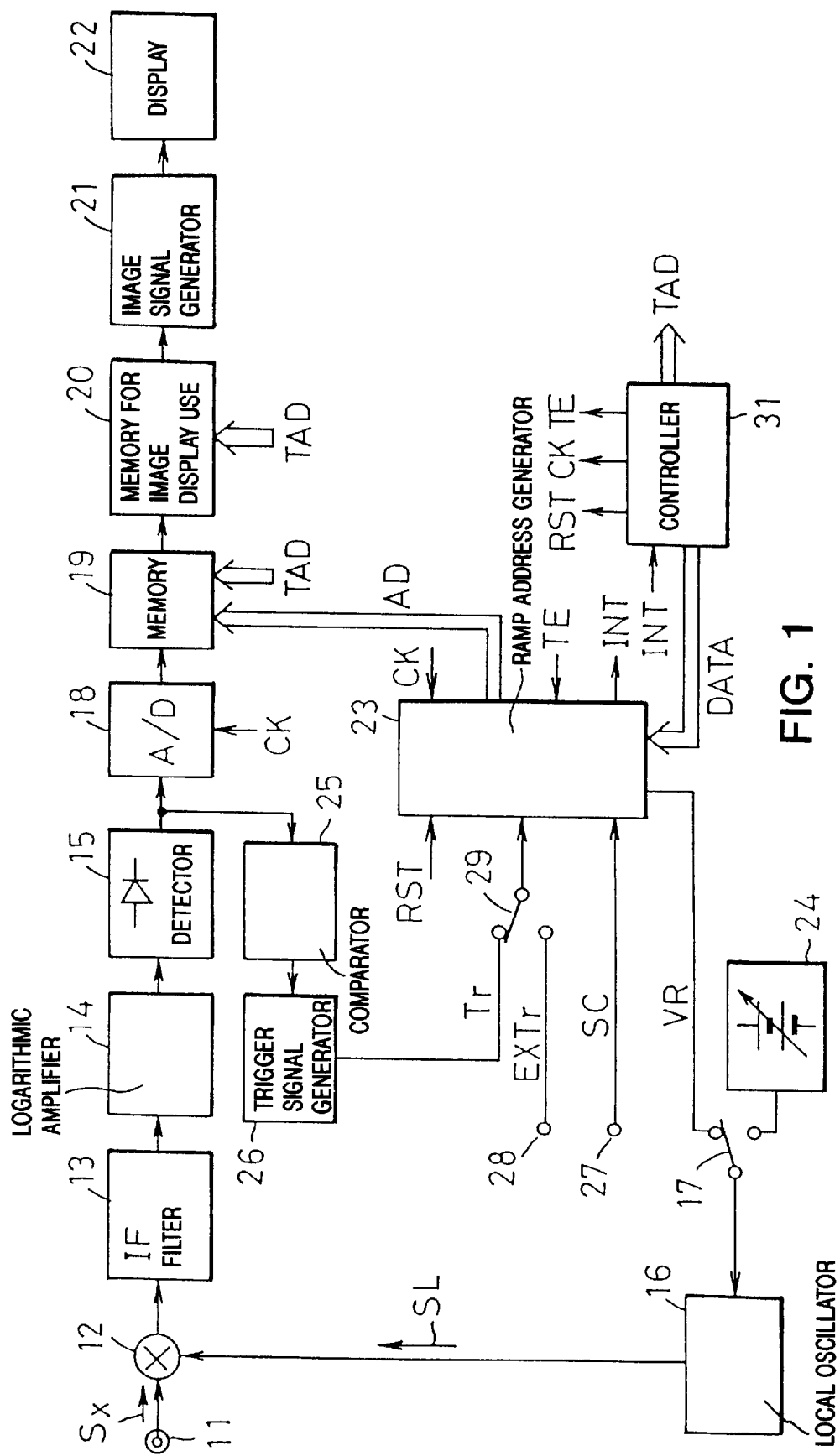
FIG. 1 is a block diagram showing the construction of a conventional spectrum analyzer.

The basic operation of the spectrum analyzer, which is made up of the mixer 12, the IF filter 13, the logarithmic amplifier 14, the detector 15, the local oscillator 16, the A/D converter 18, the signal storage memory 19, the memory for image display use 20, the variable voltage source 24, the comparator 25, the trigger signal generator 26, the ramp address generator 31, etc., is the same as in the case of FIG. 1. That is, the signal Sx input into the terminal is applied to the mixer 12, wherein it is frequency mixed with the local signal SL from the local oscillator 16, and an intermediate-frequency signal of the difference frequency is provided from the IF filter 14. Hence, by sweeping the oscillation frequency of the local oscillator 16 with the ramp voltage VR from the ramp address generator 23, an intermediate-frequency signal which represents the frequency component level varying as the sweep proceeds is obtained at the output of the IF filter 14. The intermediate-frequency signal is logarithmically amplified by the logarithmic amplifier 14 and the logarithmic amplifier output is detected by the detector 15. The detected output of the detector 15 is converted by the A/D converter 18 into a digital value, which is loaded into the memory 19 in accordance with the address AD from the ramp address generator 23. Upon completion of the loading of the signal data, the stored data of the memory 19 is transferred therefrom to the memory for image display use 12, after which signal data read out of the memory 20 is converted by the image signal generator 21 into an image signal, which is displayed on the display 22.

Figure 7:
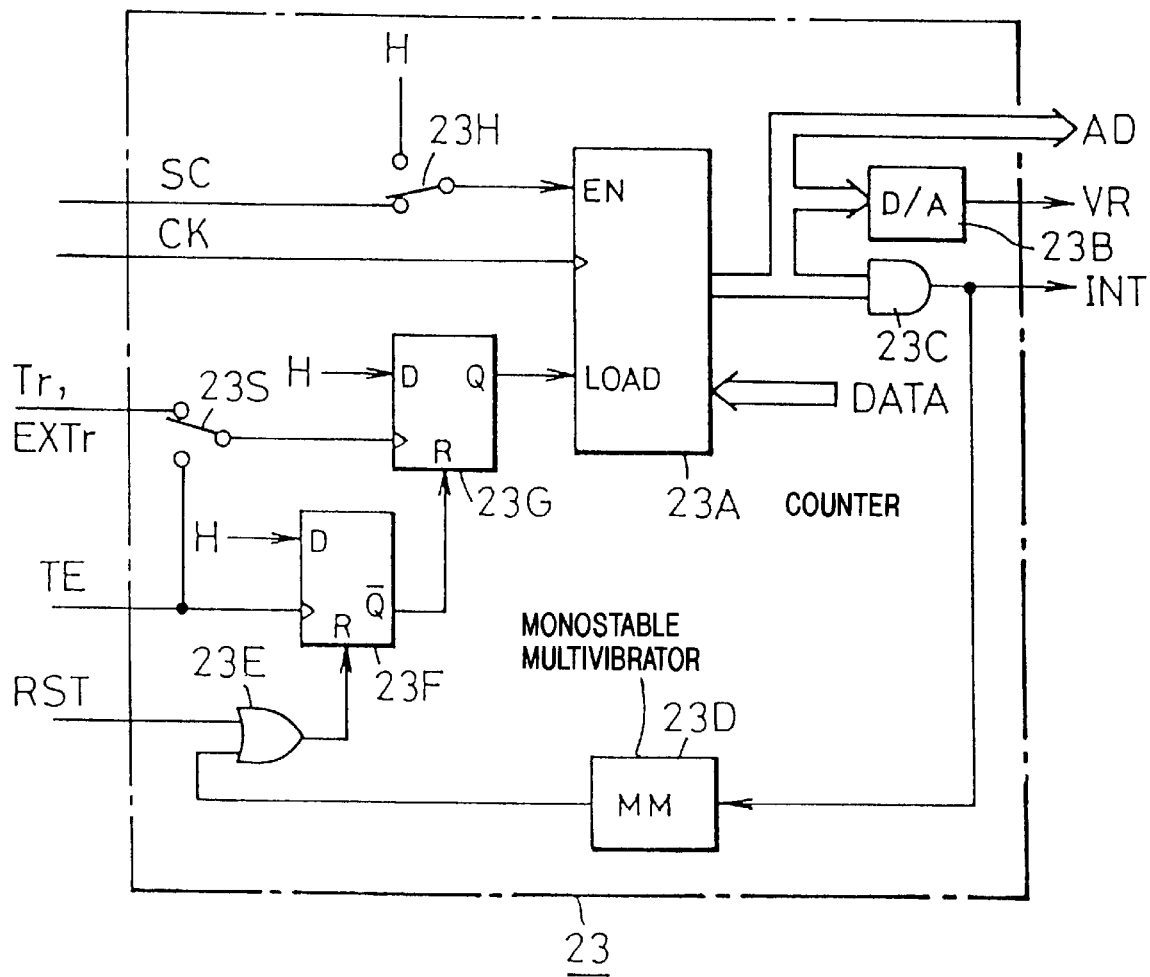
FIG. 7 is a circuit diagram illustrating an example of the construction of the ramp address generator 23 in FIG. 6.

As depicted in FIG. 7, the ramp address generator 23 is comprised of a counter 23A, a D/A converter 23B, an AND gate 23C, a monostable multivibrator (a one-shot multivibrator) 23D, an OR gate 23E, D-type flip-flops 23F and 23G and select switches 23H and 23S. The select switch 23H selects the sweep control signal SC in the case of the gated-sweep mode and a H-logic level in the case of the zero-span mode and provides it to an enable terminal EN of the counter 23A. The select switch 23S selects a trigger enable signal TE in the case of the gated-sweep mode and the trigger signal Tr or EXTr in the case of the zero-span mode and provides it to a trigger terminal of the flip-flop 23G. The flip-flops 23F and 23G are each supplied with the H-logic level at all times. Upon initiation of the operation of the spectrum analyzer, the reset signal RST is provided from the controller 31 via the OR gate 23E to the flip-flop 23F to reset it, and as a result, its inverted output Q goes to the H-logic level, holding a reset terminal R of the flip-flop 23G at the H-logic level. The flip-flop 23G is thus held in the reset state, and hence remains unchanged even if supplied with the trigger signal Tr or EXTr, and a load terminal LOAD of the counter 23A is held at the L-logic level.

Upon application of the clock CK when its terminal LOAD is held at the L-logic level, the counter 23A presets therein a data value DATA and becomes ready for starting measurement. Next, the controller 31 applies the trigger enable signal TE to the flip-flop 23F to make its inverted output Q go to the L-logic level, releasing the flip-flop 23G from the reset state and putting it into a triggerable state. In the case of the gated-sweep mode, the flip-flop 23G is immediately triggered by the trigger enable signal TE and its Q output goes to the H-logic level, but in the case of the zero-span mode, the flip-flop 23G is triggered by the trigger signal Tr or EXTr.

When the internal trigger signal Tr derived from the signal to be measured Sx, for example, or the external trigger signal EXTr from the terminal 28 is applied to the flip-flop 23G to trigger it, its non-inverted output Q goes to the H-logic level, holding the terminal LOAD of the counter 23A at the H-logic level. When the load terminal LOAD of the counter 23A goes to the H-logic level in the state in which its enable terminal EN is held at the H-logic level, the counter begins counting at the preset data value DATA. The count values of the counter 23A are sequentially provided as the address AD and at the same time they are converted by the D-A converter 23B into analog form and output as the ramp voltage VR. The AND gate 23C outputs the AND's of all bits of the count value output, and consequently, when the count value reaches the full count (i.e. all 1's), the output of the AND gate 23C goes to the H-logic level, and the monostable multivibrator 23D responds to this to generate a pulse of a fixed width. This pulse resets the flip-flop 23F via the OR gate 23E and its inverted output Q is applied to the flip-flop 23G to reset it, making its Q output go to the L-logic level. In consequence, the counter 23A stops counting and when supplied with the next clock CK, it presets again the data value DATA.

On the other hand, the H-logic level provided from the AND gate 23C is supplied, as the interrupt signal INT indicating the completion of loading of the signal data into the memory 19, to the controller 31. Upon receiving the interrupt signal INT, the controller 31 supplies the memories 19 and 20 with the read/write address TAD for transferring the contents of the memory 19 to the memory 20, performing the data transfer. Upon completion of the transfer, the controller 31 yields and applies the trigger enable signal TE to the flip-flop 23F of the ramp address generator 23 to set it to make its inverted output Q go to the L-logic level, putting the flip-flop 23G in the triggerable state. Thereafter, the same operations as mentioned above are repeated.

As will be appreciated from the above, the sweep control terminal 27 is one that has been used in the past, and by applying the L-logic level to this terminal, it is possible to stop the sweep operation of the ramp address generator 23 (which causes address stepping and an increase in the ramp voltage) and hence stop the sweep of the frequency of the local oscillator 16 and the sweep (stepping) of the address AD which is provided to the memory 19. Moreover, by applying the H-logic level to the sweep control terminal 27, it is possible to resume the sweep operation of the ramp address generator 23 and hence restart the sweep of the oscillation frequency of the local oscillator 16 and the stepping of the address AD.

According to this embodiment, in the spectrum analyzer of the above-described construction the synchronizing signal SY, applied to the synchronizing signal input terminal 27A and synchronized with the burst wave, is applied to the sweep control signal generator 32 to yield therefrom the sweep control signal SC, which is provided to the ramp address generator 23, effecting control to continue and stop the sweep operation.

Figure 8:
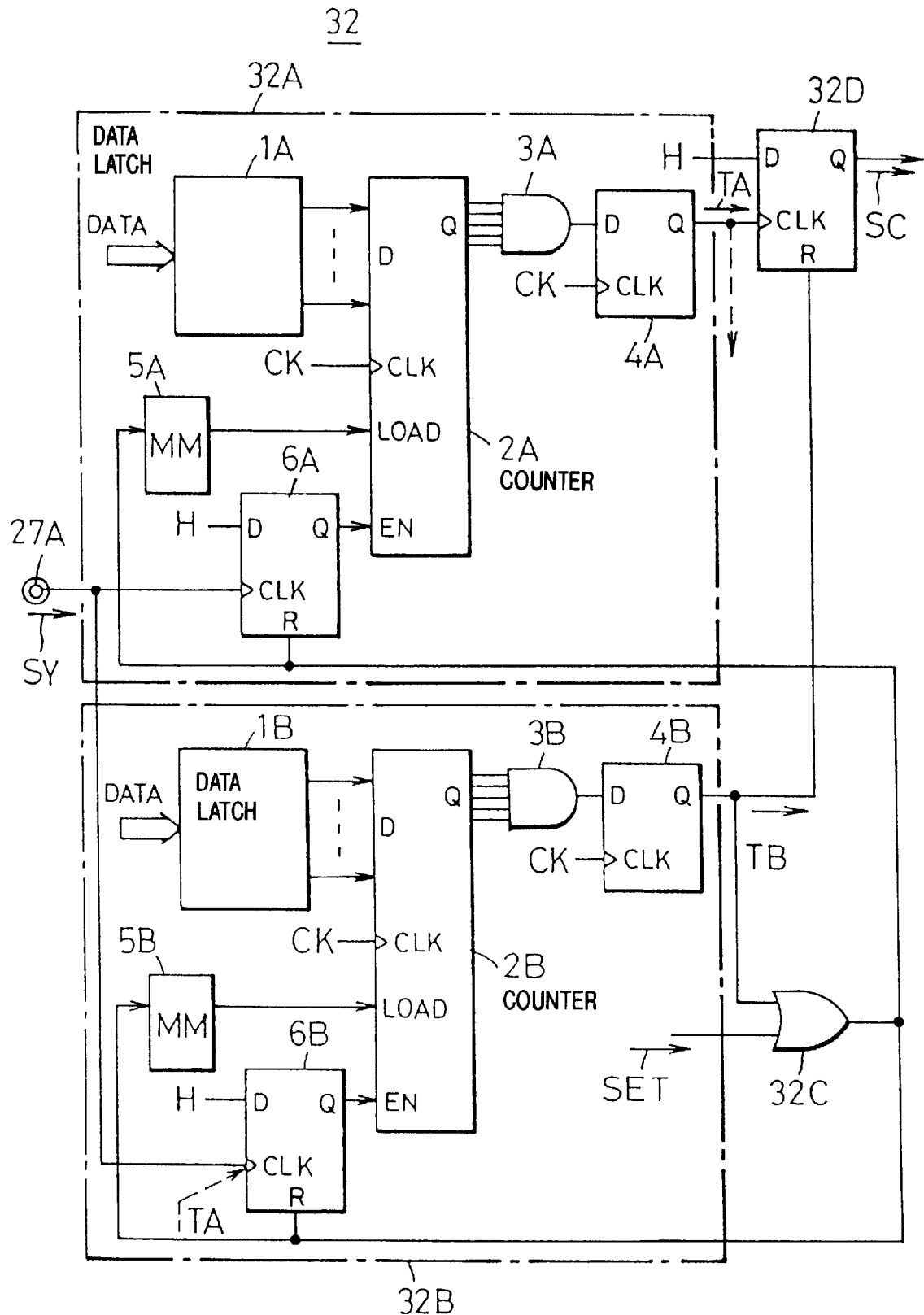
FIG. 8 is a circuit diagram illustrating an example of the construction of the sweep control signal generator 32 in FIG. 6.

The sweep control signal generator 32 can be constructed as shown in FIG. 8, for instance. The sweep control signal generator 32 is composed of a circuit 32A which controls the timing for the rise of the sweep control signal SC, a circuit 32B which controls the timing for the fall of the sweep control signal, an OR gate 32C and a D-type flip-flop 32D.

The circuit 20 for controlling the timing for the rise of the sweep control signal SC comprises: a data latch circuit 1A; a counter 2A in which data latched in the data latch circuit 1A is preset and which starts counting clock pulses at the preset value; an AND gate 3A for detecting that the counting of the counter 2A has reached the full count; a flip-flop 4A for timing use which reads the inversion of the output of the AND gate 3A to the H-logic level at the timing of the next clock CK; a monostable multivibrator 5A which instantaneously provides the H-logic level to a load terminal LOAD of the counter 2A to provide thereto a command signal for reading thereinto the data latched in the data latch circuit 1A; and a flip-flop 6A for count control use which provides the H-logic level to an enable terminal EN of the counter 2A upon application of the synchronizing signal SY, causing the counter 2A to start its counting operation.

When the spectrum analyzer is set in the gated-sweep mode, an initialization signal SET (FIG. 9, Row A) is applied from the controller 31 via the OR gate 32C to the monostable multivibrator 5A to trigger it, applying a load signal of the H-logic level to the load terminal LOAD of the counter 2A. When supplied with the load signal, the counter 2A is supplied, from the controller 31, with data DATA corresponding to the time TR from the data latch circuit 1A to the rise of the sweep control signal SC (FIG. 9, Row F) and reads the data. For example, in the case where the counter 2A is a hexadecimal counter and is set to cause the sweep control signal SC to rise at the timing of the clock pulse CK second from the timing of the synchronizing signal SY, 16−2=14 is latched in the data latch circuit 1A and "14" is preset in the counter 2A, taking it into account that the full count detected output by the AND gate 3A is loaded into the flip-flop 4A after one clock.

Figure 9:
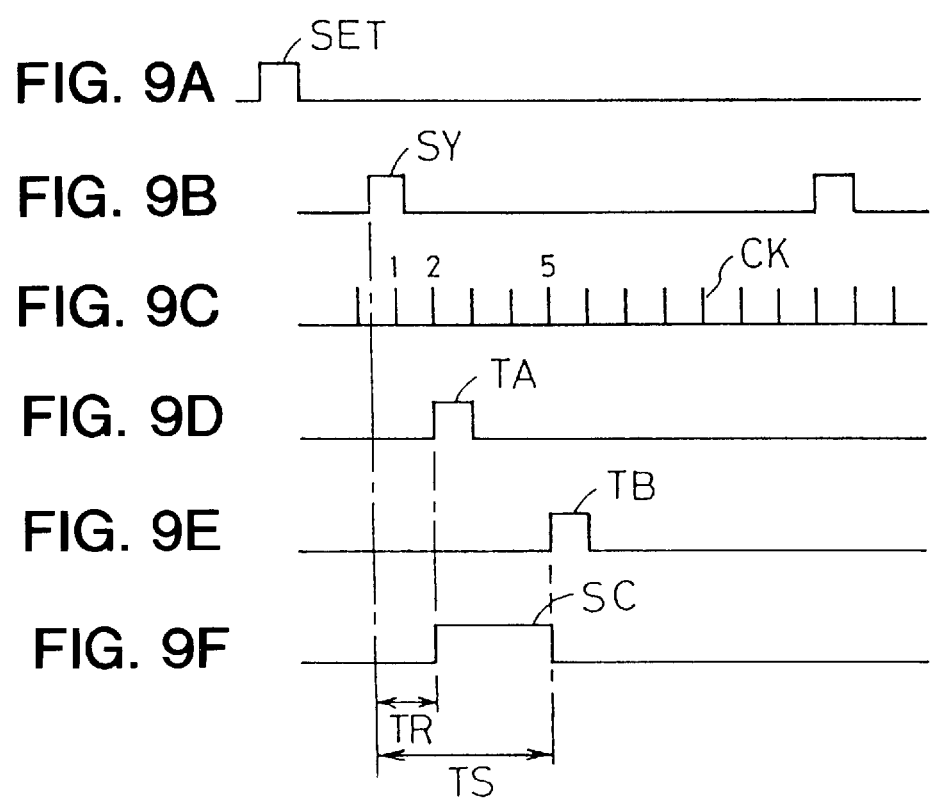
FIG. 9 is a waveform diagram for explaining the operation of the embodiment of FIG. 6.

When the synchronizing signal SY is input into the flip-flop 6A via the synchronizing signal input terminal 27A at the point of time indicated in FIG. 9, Row B after the presetting of "14" in the counter 2A, the counter 2A starts counting the clock pulses CK shown in FIG. 9, Row C. Having counted one clock pulse CK, the counter 2A enters the full count state and the AND gate 3A output the H-logic level. Then the flip-flop 4A reads thereinto the H-logic level at the timing of the next clock pulse CK and outputs a rise control signal TA (FIG. 9, Row D) via its output terminal Q. The signal TA triggers, at the timing of its rise, the flip-flop 32D to cause its non-inverted output Q to rise, which is output as the sweep control signal SC.

The circuit 32B which effects control for causing the sweep control signal SC to fall comprises, as is the case with the rise control circuit 32A, a data latch circuit 1B, a counter 2B, an AND gate 3B, a flip-flop 4B for timing use, a monostable multivibrator 5B and a flip-flop 6B for count control use.

In the data latch circuit 1B is latched data DATA, provided from the controller 31, which corresponds the time TS (see FIG. 9, Row F) from the timing of the rise of the synchronizing signal SY to the timing at which the sweep control signal SC is desired to fall. Assuming that the time TS corresponds to the time for which five clock pulses CK are generated, the counter 2B reads thereinto 16−5=11 when it is a hexadecimal counter. Consequently, the counter 2B enters the full count state when having counted four clock pulses CK, and the AND gate 3B outputs the H-logic level.

The H-logic level from the AND gate 3B is read into the flip-flop 4B at the timing of the next clock pulse CK, by which the flip-flop 4B outputs a fall control signal TB (FIG. 9, Row E). The fall control signal TB is applied to a reset terminal R of the flip-flop 32D to reset it. This reset operation causes the frequency sweep control signal SC to fall. At the same time, the fall control signal TB is provided via the OR gate 32C to reset terminals R of the flip-flops 6A and 6B for count control use to reset them. By this reset operation the counters 2A and 2B are stopped from their counting operation. Moreover, the fall control signal TB is also applied to the monostable multivibrators 5A and 5B to trigger them. Since the monostable multivibrators 5A and 5B instantaneously output the H-logic levels accordingly, the counters 2A and 2B read thereinto data corresponding to the rise time TR and fall time TS from the data latch circuits 1A and 1B, respectively, and then wait until the next synchronizing signal SY is input.

In this way, upon each application of the synchronizing signal the sweep control signal generator outputs the sweep control signal SC whose rise and fall are defined by the periods of time corresponding to the data values latched in the data latch circuits 1A and 1B. By arbitrary setting of the rise time TR and the fall time TS which are latched in the data latch circuits 1A and 1B, the sweep control signal SC can be controlled to rise and fall at arbitrary timing (within the range over which the carrier of the burst wave is present) from the leading edge of the synchronizing signal SY. Hence it is possible to execute such a gated sweep as shown in FIG. 2.

As described above, according to the first aspect of the present invention, in the case of the gated-sweep mode, when the synchronizing signal SY synchronized with the signal to be measured Sx is applied to the synchronizing signal input terminal 27A, the sweep control signal SC is available from the sweep control signal generator 32 built in the spectrum analyzer and is applied to the ramp address generator 23 to control it to generate the address AD and the ramp voltage VR or stop their generation; therefore, the spectrum analyzer can easily be operated in the gated-sweep mode. This facilitates the use of the spectrum analyzer. Moreover, with the construction that permits arbitrary setting of the timing for the rise and fall of the frequency sweep control signal SC as in the above-described embodiment, it is possible to make a frequency analysis of the burst wave for an arbitrary timing period thereof.

Figure 10:
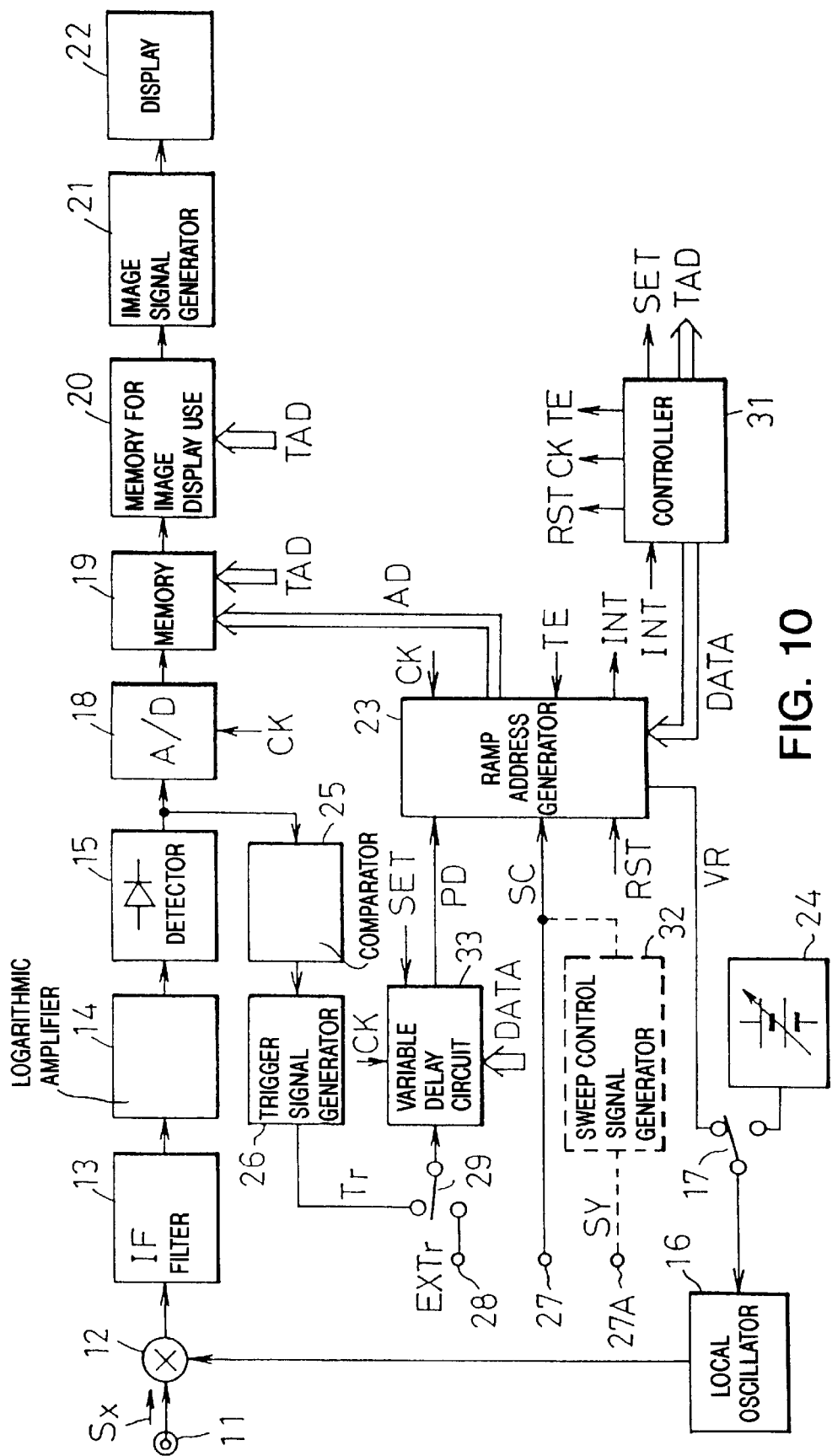
FIG. 10 is a block diagram illustrating an embodiment according to the second aspect of the present invention.

FIG. 10 illustrates an embodiment of the spectrum analyzer according to the second aspect of the present invention. In FIG. 10 the parts corresponding to those in FIG. 6 are identified by the same reference numerals and no description will be given of them. This embodiment has a construction in which the trigger signal Tr available from the trigger signal generator 26 or the trigger signal EXTr provided to the terminal 28 is applied via a variable delay circuit 33 to the flip-flop 23G of the ramp address generator 23 (see FIG. 7).

Figure 11:
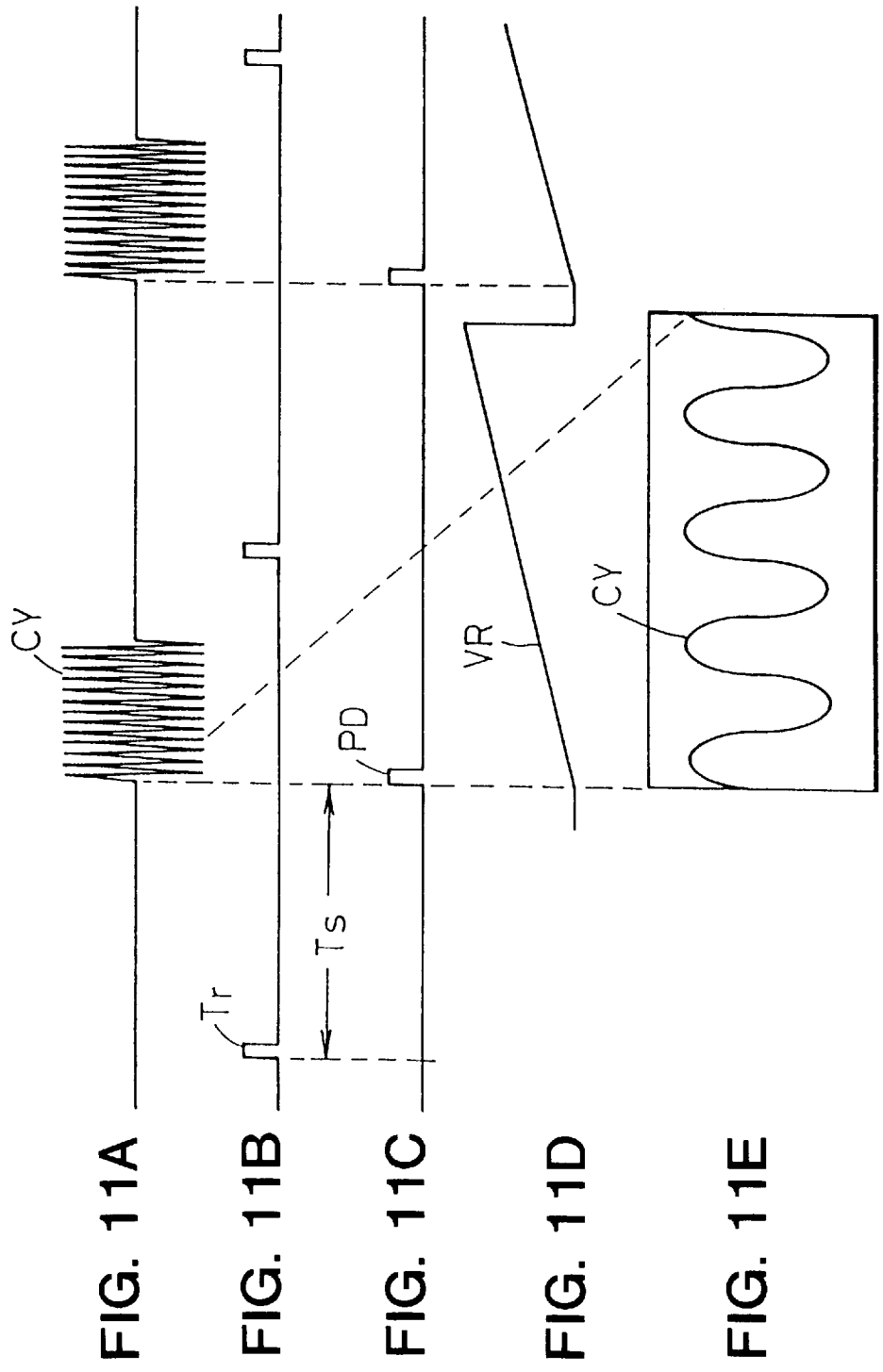
FIG. 11 is a waveform diagram for explaining the zero-span mode of operation of the embodiment shown in FIG. 10.

That is, in this example the variable delay circuit 33 is provided between the output side of the select switch 29 for selecting either one of the trigger signal generator 26 and the external trigger terminal 28 and the ramp address generator 23. For example, in the case where the waveform of such a burst wave as shown in FIG. 11, Row A is displayed in the zero-span mode, the trigger signal Tr (or EXTr) which is supplied to the ramp address generator 23 is delayed for a delay time set in the variable delay circuit 33 as shown in FIG. 11, Rows B and C. By this, the generation of the address AD to be provided to the memory 19 is delayed for an arbitrary period of time, causing the rise of the ramp voltage VR and the starting time point of the signal loading into the memory 19 to be synchronized with each other as shown in FIG. 11, Rows D and E.

Figure 12:
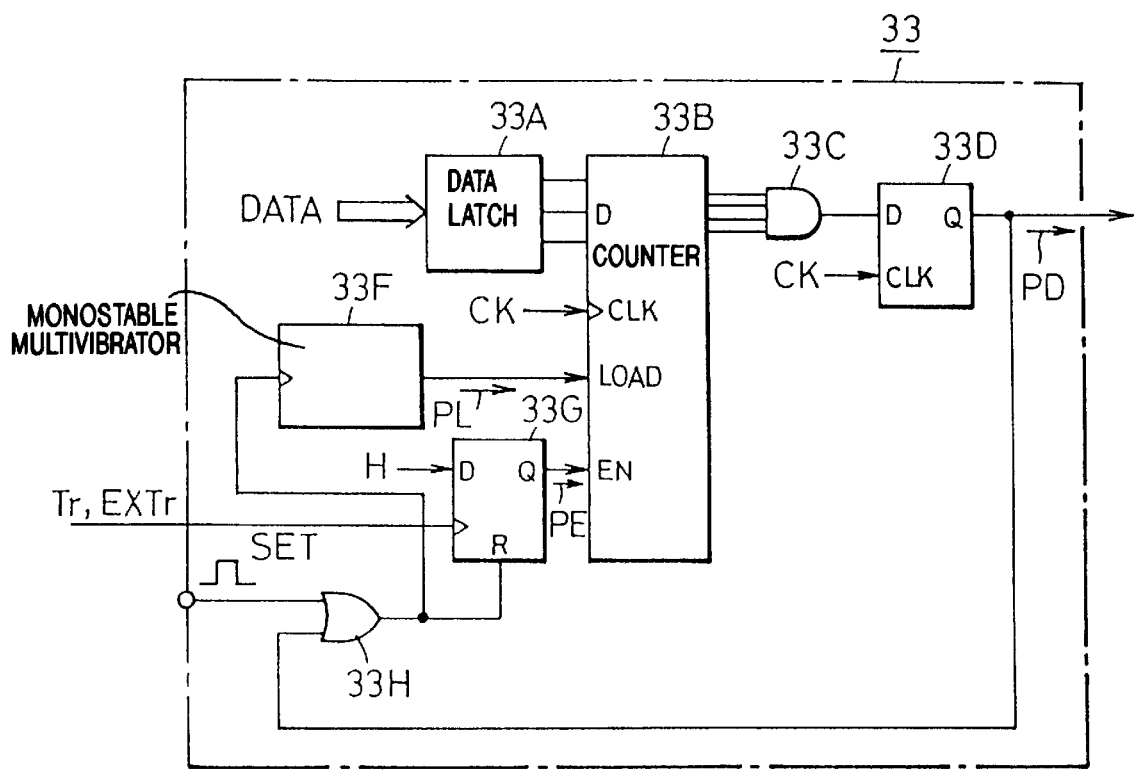
FIG. 12 is a diagram showing an example of the construction of a variable delay circuit 33 in FIG. 10.

For example, as shown in FIG. 12, the variable delay circuit 33 can be made identical in construction with the fall control circuit 32B depicted in FIG. 8. In FIG. 12, reference numeral 33A denotes a data latch circuit which sets therein delay time data provided from the controller 31. The data set in the data latch circuit 33A is loaded into a counter 33B to control its count value until the counter 33A reaches the full count. For example, in the case where the counter 33A is a hexadecimal counter and the data latch circuit 33A has latched therein a numerical value "10", the counter 33A reaches the full count when having counted five clock pulses CK, and the output of an AND gate 33C goes to the H-logic level. This H-logic level is read into a flip-flop 33D upon application of the next clock pulse CK, and its output Q goes to the H-logic level. Hence a delayed trigger signal PD which is obtained at the Q output of the flip-flop 33D is delayed behind the input trigger signal Tr for a period of time corresponding to six clock pulses CK. In this way, the number of clock pulses for the counter 33B to reach the full count can be controlled in accordance with the numerical value which is latched in the data latch circuit 33A.

Figure 13:
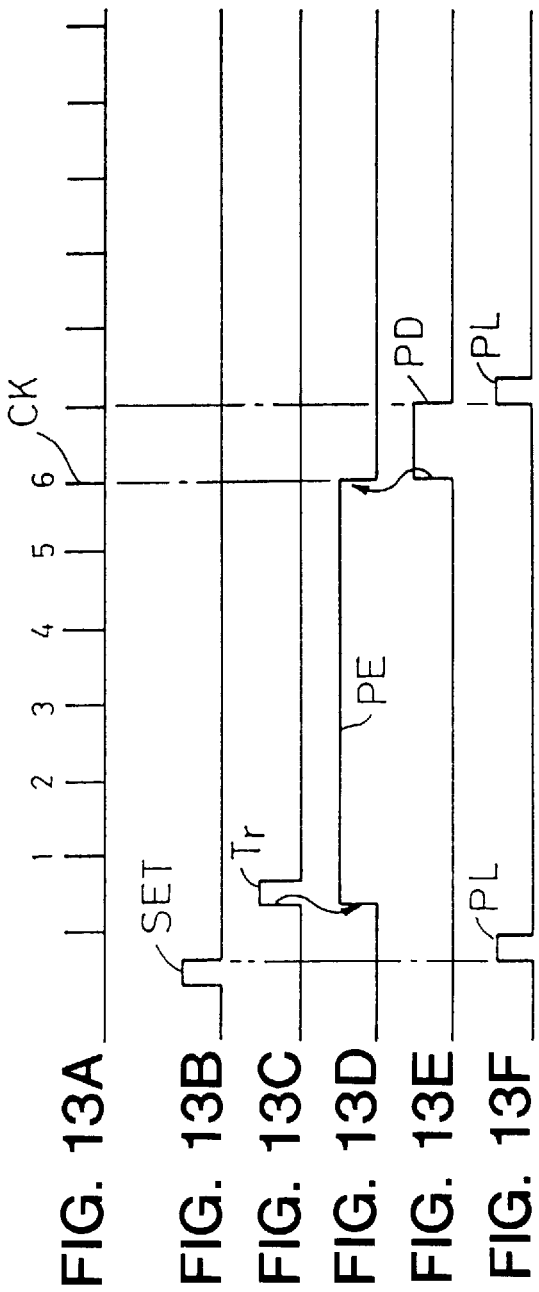
FIG. 13 is a waveform diagram for explaining the operation of the variable delay circuit depicted in FIG. 12.

The counter 33B is supplied at its clock terminal CLK with the clock CK shown in FIG. 13, Row A. To its load input terminal LOAD is applied from a monostable multivibrator 33F a load command pulse PL (FIG. 13, Row F) which instantaneously goes to the H-logic level. Upon each application of the load command pulse PL, the counter 33B loads therein the data latched in the data latch circuit 33A. The monostable multivibrator 33F output the load command pulse PL upon each application of an initialization signal SET (FIG. 13, Row B) or delay pulse PE (FIG. 13, Row D).

The trigger signal Tr available from the trigger signal generator 26 (or the external trigger signal EXTr provided to the terminal 28) is applied to a clock input terminal CLK of a D-type flip-flop 33G for count control use. The H-logic level is always provided to a data input terminal D of the D-type flip-flop 33G and this H-logic level is read therein at the timing of the rise of the trigger signal Tr. The pulse PE of the H-logic level (FIG. 13, Row D) which is output from the flip-flop 33G is applied to an enable terminal EN of the counter 33B. During the application of the H-logic level to the enable terminal EN the counter 33B counts the clock pulses CK, and when the count value reaches the full count, the AND gate 33C outputs the H-logic level. Upon occurrence of the next clock pulse CK the H-logic level is read into the D-type flip-flop 33D, which outputs the delayed trigger signal PD (FIG. 13, Row E) to its Q output terminal.

The delayed trigger signal PD provided at the Q output terminal is applied via an OR gate 33H to a trigger terminal of the monostable multivibrator 33F and a reset terminal R of the flip-flop 33G. The monostable multivibrator 33F outputs the load command pulse PF (FIG. 13, Row F) at the trailing edge of the signal PD. The flip-flop 33G is reset, stopping the counting operation of the counter 33B. In this state the variable delay circuit 33 waits until the input of the next trigger signal Tr.

By applying the delayed trigger signal PD from the variable delay circuit 33 to the ramp address generator 23 shown in FIG. 10 to start the loading of data into the memory 19 in synchronization with the timing of the rise of the ramp voltage VR, the loading of data into the memory 19, starting at its leading address, begins after the delay time TS provided by the variable delay circuit 33. As a result, data can be loaded into the memory 19, starting at the timing when the carrier CY of the burst wave shown in FIG. 11, Row A is present. Hence only the carrier CY can be displayed in enlarged form on the display 22 as shown in FIG. 11, Row E.

As described above, according to the second aspect of the present invention, by setting the delay time TS in the variable delay circuit 33 so that signal portion CY of the signal to be measured Sx which is desired to observe may lead the data to be loaded into the memory 19 (see FIG. 11, Row C), the signal portion CY (see FIG. 11, Row A) can be loaded into the memory, starting at the leading address thereof. Thus, by enlarging the time axis of the display 22, the signal portion CY desired to observe can be displayed in enlarged form on the display 22 as shown in FIG. 11, Row E, and hence can be observed with high accuracy.

Figure 14:
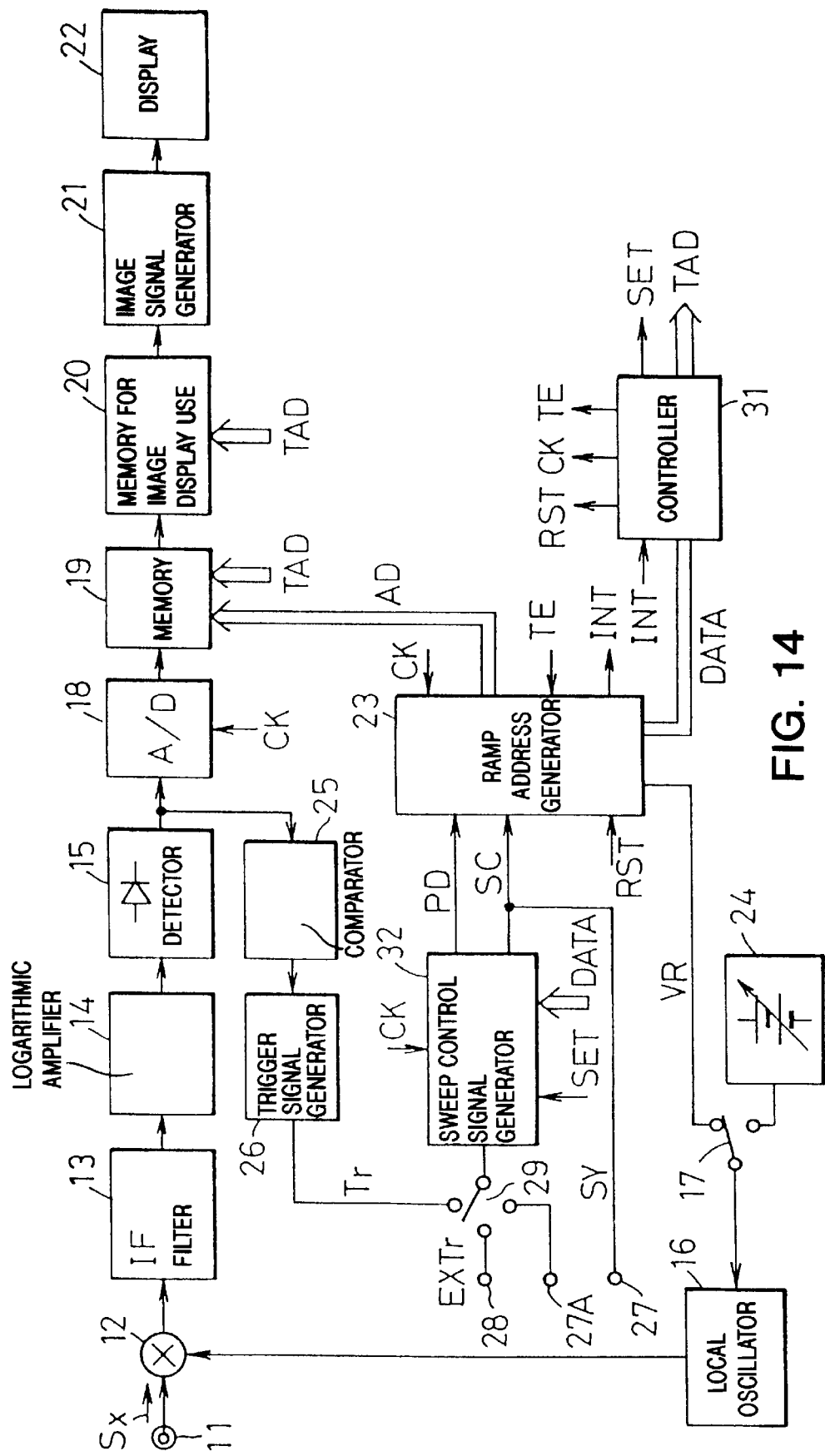
FIG. 14 is a block diagram illustrating an embodiment in which the sweep control signal generator 32 serves also as the variable delay circuit 33.

It is also possible to employ a construction that the sweep control signal generator 32 used in the FIG. 6 embodiment is provided as indicated by the broken line in the FIG. 10 embodiment so as to derive the desired sweep control signal SC from the synchronizing signal SY which is applied to the terminal 27A from the outside. In this instance, provision can be made so that the variable delay circuit 33 serves also as the fall control circuit 32B of the sweep control signal generator 32 shown in FIG. 8 since the former is identical in construction with the latter as depicted in FIG. 12. FIG. 14 illustrates an embodiment of the spectrum analyzer of such a construction and FIG. 15 the construction of the sweep signal generator 32 used also as the variable delay circuit.

Figure 15:
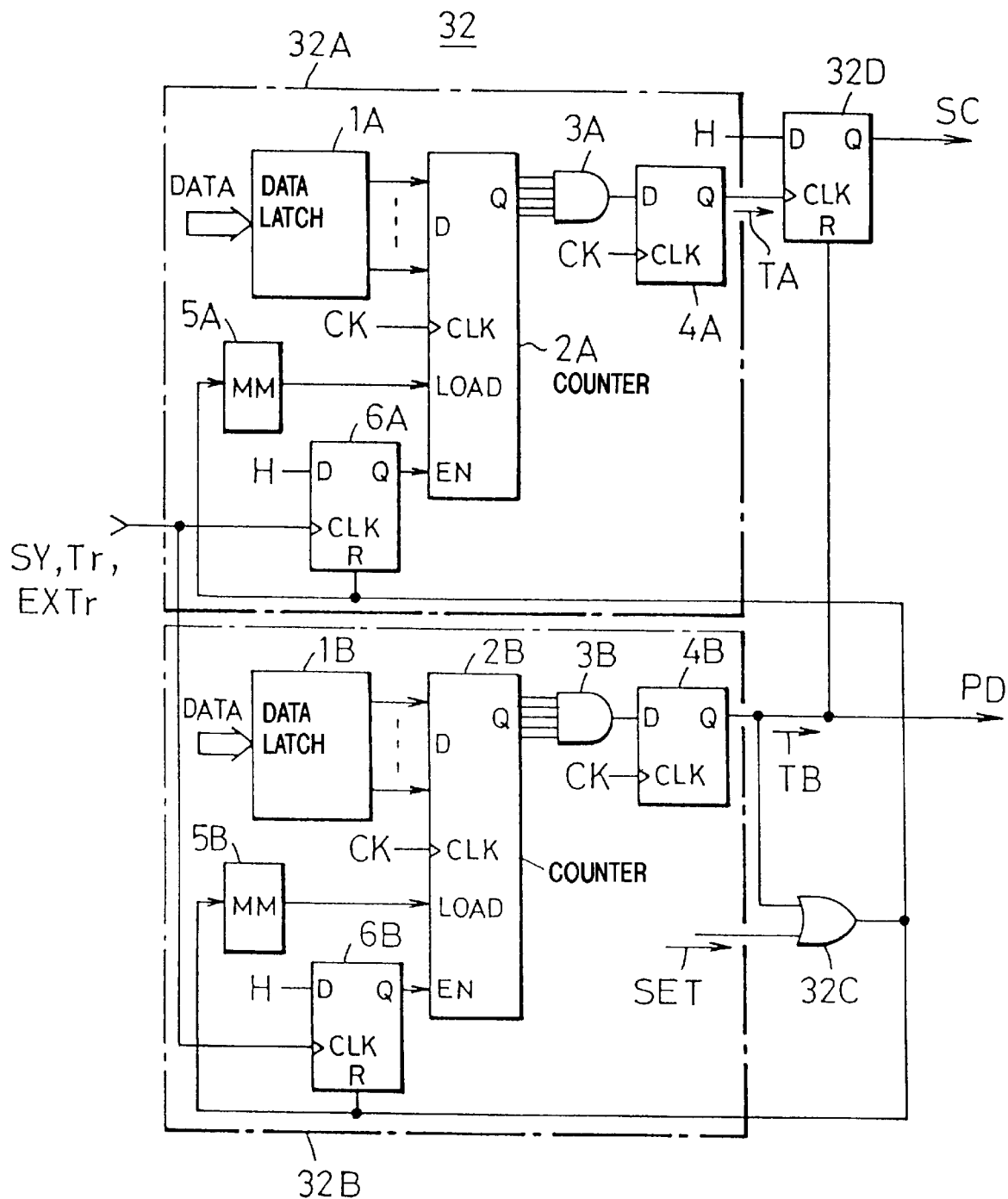
FIG. 15 is a circuit diagram showing an example of the sweep control signal generator 32 in FIG. 14.

As depicted in FIG. 14, the select switch 29 selects any one of the internal trigger signal Tr, the external trigger signal EXTr and the external synchronizing signal SY and applies the selected signal to the clock terminals CLK of the flip-flops 6A and 6B in the sweep control signal generator 32 shown in FIG. 15. As shown in FIG. 15, the sweep control signal generator 32 outputs, as the sweep control signal SC, the Q output of the flip-flop 32D and applies it to the select switch 23H of the ramp address generator 23 (see FIG. 7) as in the case of FIG. 8. The Q output TB of the flip-flop 4B of the fall control circuit 32B, which is used also as the variable delay circuit, is output as the delayed trigger signal PD, which is applied to the select switch 23S of the ramp address generator 23.

In the case of deriving the sweep control signal SC from the external synchronizing signal SY in the frequency analysis mode, the switch 32E is turned ON. In this case, as described previously with respect to FIG. 8, the rise control circuit 32A and the fall control circuit 32B operate to output the sweep control signal SC via the switch 32E, which is applied to the ramp address generator 23. In the case of the zero-span mode, that is, in the case of inputting the internal trigger signal Tr or the external trigger signal EXTr via the select switch 29, the switch 32E is turned OFF. In this instance, the operation of the rise control circuit 32A is ignored and the fall control circuit 32B performs the same operation as that of the variable delay circuit 33 depicted in FIG. 12 and the output TB of the flip-flop 4B is provided as the delayed trigger signal PD via the switch 32F, which is applied to the ramp address generator 23.

I claim:

1. A spectrum analyzer which comprises: local oscillator means for generating a frequency-sweepable local signal; frequency mixer means for frequency mixing said local signal and a signal to be measured to output an intermediate-frequency signal; detector means for detecting the amplitude of said intermediate-frequency signal; A-D converter means for converting the detected output of said detector means into a digital signal to output signal data; signal loading memory means for storing said signal data; ramp address generator means for supplying said local oscillator means with a sweep voltage for sweeping its oscillation frequency and said signal loading memory means with a sequence of sweep addresses for write use; display means for converting signal data read out of said signal loading memory means into an image signal and for displaying said image signal; and controller for effecting control to transfer said signal data from said signal loading memory means to said display means upon each completion of the address sweep of said ramp address generator means;

which further includes:

a synchronizing signal input terminal for inputting an external synchronizing signal synchronized with said signal to be measured in a frequency analysis mode; and sweep control signal generator means for generating a sweep control signal delayed for a desired period of time relative to the synchronizing signal input via said synchronizing signal input terminal, said sweep control signal being applied to said ramp address generator means to control the start and stop of its sweep operation.

2. The spectrum analyzer of claim 1, wherein said sweep control signal generator means includes: a rise control circuit for generating a first control signal a first period of time after said external synchronizing signal; a fall control circuit for generating a second control signal a second period of time after said external synchronizing signal, said second period of time being longer than said first period of time; and flip-flop means for generating said sweep control signal which responds to said first control signal to rise and responds to said second control signal to fall.

3. The spectrum analyzer of claim 2, which further includes select switching means for supplying a trigger signal provided thereto in a zero-span mode to said fall control circuit and wherein said second control signal provided from said fall control circuit in response to said trigger signal is applied as a delayed trigger signal to said ramp address generator means to start its sweep operation.

4. The spectrum analyzer of claim 1, which further includes variable delay means generating a delayed trigger signal by delaying, for an arbitrarily set period of time, a trigger signal provided thereto in a zero-span mode, said delayed trigger signal being applied to said ramp address generator means to start its sweep operation.

5. A spectrum analyzer which comprises: local oscillator means for generating a frequency-sweepable local signal; frequency mixer means for frequency mixing said local signal and a signal to be measured to output an intermediate-frequency signal; detector means for detecting the amplitude of said intermediate-frequency signal; A-D converter means for converting the detected output of said detector means into a digital signal to output signal data; signal loading memory means for storing said signal data; ramp address generator means for supplying said local oscillator means with a sweep voltage for sweeping its oscillation frequency and said signal loading memory means with a sequence of sweep addresses for write use; display means for converting signal data read out of said signal loading memory means into an image signal and for displaying said image signal; and controller for effecting control to transfer said signal data from said signal loading memory means to said display means upon each completion of the address sweep of said ramp address generator means;

which further includes:

variable delay means whereby, in a zero-span mode, a trigger signal provided thereto is delayed for an arbitrarily set period of time to generate a delayed trigger signal, said delayed trigger signal being applied to said ramp address generator means to start its sweep operation.

6. The spectrum analyzer of claim 1 or 5, which further includes: trigger signal generator means whereby an internal trigger signal synchronized with said signal to be measured is derived from the detected output of said detector means; an external trigger input terminal for inputting an external trigger signal; and select switching means for selecting either one of the output of said trigger signal generator means and said external trigger input terminal and for applying it as said trigger signal to said ramp address generator means.

7. The spectrum analyzer of claim 5, wherein said ramp address generator means includes: counter means for counting clock pulses and for supplying the count value as said sweep address to said signal loading memory means; detector means for detecting that said counter means has reached a preset value and for outputting a detected signal; counting control means which responds to the detected signal from said detector means to provide a trigger signal inhibit state and responds to a trigger enable signal to release said inhibit state and then responds to a trigger signal to supply said counter means with a counting control signal for starting its counting operation; and A-D converter means for converting said count value into an analog voltage and for outputting it as a ramp signal for controlling the oscillation frequency of said local oscillator; and wherein said sweep control signal is applied to an enable terminal of said counter means to control its counting enable state and said controller responds to said detected signal to effect control for transferring said signal data from said signal loading memory means to said display means and outputs said trigger enable signal after the completion of the transfer.

8. The spectrum analyzer of claim 5, wherein said variable delay means includes: flip-flop means which is reset by said delayed trigger signal into a trigger enable state and is triggered by the next trigger signal to output a counting enable signal; counter means which is put by said counting enable signal into a counting enable state and counts clock pulses; and detector means for detecting that the count value of said counter means has reached a value corresponding to said set period of time and for generating said delayed trigger signal.

* * * * *